USO10355078B2

United States Patent
Kono et al.

(10) Patent No.: US 10,355,078 B2
(45) Date of Patent: Jul. 16, 2019

(54) SEMICONDUCTOR DEVICE

(71) Applicant: KABUSHIKI KAISHA TOSHIBA, Tokyo (JP)

(72) Inventors: Hiroshi Kono, Himeji Hyogo (JP); Takuma Suzuki, Himeji Hyogo (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 0 days.

(21) Appl. No.: 15/243,522

(22) Filed: Aug. 22, 2016

(65) Prior Publication Data

US 2017/0271437 A1  Sep. 21, 2017

(30) Foreign Application Priority Data

Mar. 16, 2016 (JP) ................. 2016-053104

(51) Int. Cl.
*H01L 29/06* (2006.01)
*H01L 29/10* (2006.01)
(Continued)

(52) U.S. Cl.
CPC ........ *H01L 29/063* (2013.01); *H01L 29/0696* (2013.01); *H01L 29/1095* (2013.01); *H01L 29/1608* (2013.01); *H01L 29/7813* (2013.01)

(58) Field of Classification Search
CPC ............... H01L 29/063; H01L 29/7813; H01L 29/0696; H01L 29/1608; H01L 29/1095;
(Continued)

(56) References Cited

U.S. PATENT DOCUMENTS 5,864,159 A   1/1999  Takahashi
7,825,449 B2  11/2010 Suzuki et al.
(Continued)

FOREIGN PATENT DOCUMENTS

JP  2002-270841 A  9/2002
JP  2009-043966 A  2/2009
(Continued)

OTHER PUBLICATIONS

Japanese Office Action dated May 22, 2018, filed in counterpart Japanese Patent Application No. 2016-053104 (12 pages) (with translation).

*Primary Examiner* — Moin M Rahman
(74) *Attorney, Agent, or Firm* — Kim & Stewart LLP

(57) ABSTRACT

A device includes a silicon carbide layer between first and second electrodes. The silicon carbide layer includes first region, second region between the first region and second electrode, and third region between the second region and second electrode. The device includes first and second trenches, through the second and third regions and terminating within the first region, having a layer formed thereon, and spaced by portions of the second and third regions. The silicon carbide layer includes fourth region between the third region and first trench, and fifth region between the third region and second trench. The second region includes a fourth portion between first and second portions, and a fifth portion between second and third portions. The first, second, and third portions have lower impurity than the fourth and fifth portions, and the fourth and fifth portions extend closer to the first electrode than do the other portions.

16 Claims, 5 Drawing Sheets

(51) Int. Cl.
*H01L 29/16* (2006.01)
*H01L 29/78* (2006.01)

(58) Field of Classification Search
CPC ........... H01L 29/4236; H01L 29/66704; H01L 29/66734; H01L 29/7397; H01L 29/7825
See application file for complete search history.

(56) References Cited

U.S. PATENT DOCUMENTS

| | | |
|---|---|---|
| 7,855,412 B2 | 12/2010 | Matsuki et al. |
| 2008/0199997 A1* | 8/2008 | Grebs ................. H01L 21/3065 438/270 |
| 2011/0303925 A1* | 12/2011 | Nishimura ........ H01L 21/26586 257/77 |
| 2015/0115286 A1* | 4/2015 | Takeuchi ............ H01L 21/8213 257/77 |

FOREIGN PATENT DOCUMENTS

| | | | |
|---|---|---|---|
| JP | 2011-109021 A | 6/2011 | |
| JP | 2015-153893 A | 8/2015 | |

* cited by examiner

SEMICONDUCTOR DEVICE

CROSS-REFERENCE TO RELATED APPLICATION

This application is based upon and claims the benefit of priority from Japanese Patent Application No. 2016-053104, filed Mar. 16, 2016, the entire contents of which are incorporated herein by reference.

FIELD

Embodiments described herein relate generally to a semiconductor device.

BACKGROUND

Silicon carbide is expected to be used as a material in the next generation semiconductor device. Silicon carbide has excellent physical properties such as three times the bandgap, ten times the breakdown field strength, and three times the thermal conductivity as compared to silicon. As a result, it is possible to create a semiconductor device which is capable of achieving low power loss while operating at a high temperature using silicon carbide.

As a structure for reducing on-state resistance of a metal oxide semiconductor field effect transistor (MOSFET) manufactured using silicon carbide, there is a trench gate type MOSFET in which a gate electrode is provided in a trench. In order to further reduce on-state resistance in the trench gate type MOSFET, it is preferable to decrease a channel length. However, when the channel length is decreased, undesirable channel leakage current flowing between a drain and a source when the MOSFET is turned off is increased.

DETAILED DESCRIPTION

Figure 1:
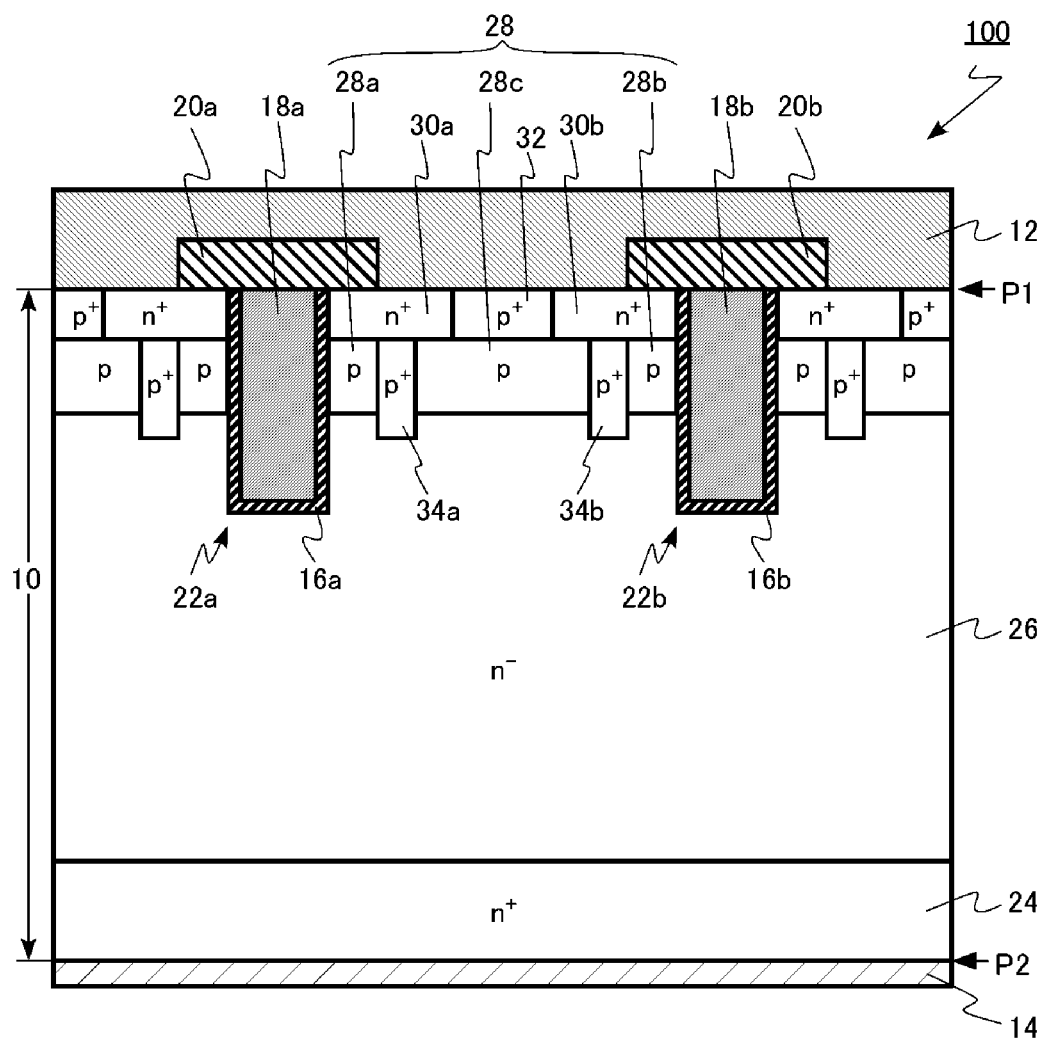
FIG. 1 is a schematic sectional view of a semiconductor device according to a first embodiment.

According to the embodiments, there is provided a semiconductor device which is capable of reduced channel leakage current.

In general, a semiconductor device includes a first electrode, a second electrode, and a silicon carbide layer interposed between the first electrode and the second electrode. The silicon carbide layer includes a first region of a first conductivity type between the first electrode and the second electrode, a second region of a second conductivity type between the first region and the second electrode, and a third region of the second conductivity type between the second region and the second electrode. The semiconductor device further includes a first trench extending through the second and third regions and terminating within the first region. The first trench has an insulating layer formed on the sidewalls and base thereof and a second trench spaced from the first trench with portions of the second and third regions therebetween. The second trench extends through the second and third regions and terminates within the first region. The second trench has an insulating layer formed on the sidewalls and base thereof. The silicon carbide layer further includes a fourth and a fifth region of the first conductivity type. The fourth region is interposed between the third region and the first trench, and the fifth region is interposed between the third region and the second trench. The second region includes a first portion, a second portion, a third portion, a fourth portion, and a fifth portion. The fourth portion is interposed between the first portion and the second portion, and the fifth portion is interposed between the second portion and the third portion. The first, second, and third portions have a lower impurity concentration of the second type impurity than the fourth and fifth portions, and the fourth and fifth portions extend closer to the first electrode than do the first, second, and third portions.

Hereinafter, embodiments of the disclosure will be described with reference to the drawings. Note that, in the following description, the same or equivalent components are denoted by the same reference numerals and the description of the mentioned components will not be repeated.

In addition, in the following description, $n^+$, n, and $n^-$, and $p^+$, p, and $p^-$ represent relative levels of the impurity concentration in the respective conductivity type. That is, $n^+$ exhibits a relatively higher n type impurity concentration than n, and $n^-$ exhibits a relatively lower n type impurity concentration than n. In addition, $p^+$ exhibits a relatively higher p type impurity concentration than p and p exhibits a relatively lower p type impurity concentration than p. Note that, $n^+$ type and $n^-$ type are simply referred to as n type, and $p^+$ type and $p^-$ type are simply referred to as p type in some cases.

The impurity concentration can be measured by using, for example, a secondary ion mass spectrometry (SIMS). Further, the relative level of the impurity concentration can be determined by the level of carrier concentration which is obtained by using, for example, the scanning capacitance microscopy (SCM). In addition, a distance such as a depth of an impurity region can be obtained by using, for example, SIMS. Also, a distance such as the depth of the impurity region can be obtained from, for example, a synthetic image of a SCM image and an atomic force microscope (AFM) image.

First Embodiment

FIG. 1 is a schematic sectional view of the semiconductor device according to the embodiment. The semiconductor device according to the embodiment is a trench gate type vertical MOSFET 100 which uses silicon carbide. Hereinafter, an example of a case where the first conductivity type is an n type and the second conductivity type is a p type will be described.

The MOSFET 100 includes a silicon carbide layer 10, a source electrode 12, a drain electrode 14, a first gate insulating film 16a, a second gate insulating film 16b, a first gate electrode 18a, a second gate electrode 18b, a first interlayer insulating film 20a, a second interlayer insulating film 20b, a first trench 22a, and a second trench 22b.

In the silicon carbide layer 10, an $n^+$ type drain region 24, an $n^-$ type drift region (the first silicon carbide region) 26, a p type body region 28, an $n^+$ type first source region (the second silicon carbide region) 30a, an $n^+$ type second source region (the third silicon carbide region) 30b, a $p^+$ type contact region 32, a $p^+$ type first stopper region (the sixth silicon carbide region) 34a, and a p⁺ type second stopper region (the seventh silicon carbide region) 34b are provided.

The p type body region 28 is provided with a p type first channel region (the fourth silicon carbide region) 28a, a p type second channel region (the fifth silicon carbide region) 28b, and an intermediate region (eighth silicon carbide region) 28c.

The silicon carbide layer 10 is single crystal SiC. The silicon carbide layer 10 is, for example, 4H—SiC.

The silicon carbide layer 10 has a first surface ("P1" in FIG. 1) and a second surface ("P2" in FIG. 1). Hereinafter, the first surface is referred to as a front surface, and the second surface is referred to as a rear surface. Note that, hereinafter, a "depth" means a depth with respect to the first surface.

The first surface is, for example, inclined at an angle in a range from 0° to 8° with respect to a (0001) plane. In addition, the second surface is, for example, inclined at an angle in a range from 0° to 8° with respect to a (000-1) plane. The (0001) plane is referred to as a silicon surface. The (000-1) plane is referred to as a carbon surface.

The n⁺ type drain region 24 is provided on the rear surface of the silicon carbide layer 10. The drain region 24 contains, for example, nitrogen (N) as an n⁻ type impurity. The impurity concentration of the n⁻ type impurity of the drain region 24 is, for example, in a range from $1 \times 10^{18}$ cm⁻³ to $1 \times 10^{21}$ cm⁻³.

The n⁻ type drift region 26 is provided on the drain region 24. The drift region 26 contains, for example, nitrogen (N) as an n⁻ type impurity. The impurity concentration of the n⁻ type impurity of the drift region 26 is lower than the impurity concentration of the n⁻ type impurity of the drain region 24. The impurity concentration of the n⁻ type impurity of the drift region 26 is, for example, in a range from $4 \times 10^{14}$ cm⁻³ to $6 \times 10^{16}$ cm⁻³. The thickness of the drift region 26 is, for example, in a range from 5 μm to 150 μm.

The p type body region 28 is provided between the drift region 26 and the front surface of the silicon carbide layer 10. The p type body region 28 includes a p type first channel region 28a, a p type second channel region 28b, and a p type intermediate region 28c.

The first channel region 28a and the second channel region 28b function as the channel of the MOSFET 100.

The first channel region 28a is provided between the drift region 26, the first source region 30a, the first gate insulating film 16a and the second gate insulating film 16b.

The second channel region 28b is provided between the drift region 26, the second source region 30b, the first channel region 28a and the second gate insulating film 16b.

The intermediate region 28c is provided between the drift region 26, the source electrode 12, the first channel region 28a and the second channel region 28b. The intermediate region 28c is provided between the first stopper region 34a and the second stopper region 34b.

The body region 28 contains, for example, aluminum (Al) as a p type impurity. The impurity concentration of the p type impurity of the body region 28 is, for example, in a range from $1 \times 10^{17}$ cm⁻³ to $5 \times 10^{17}$ cm⁻³.

The impurity concentration of the p type impurity is substantially the same in each of the first channel region 28a, the second channel region 28b, and the intermediate region 28c. The first channel region 28a and the second channel region 28b have the same impurity concentration which is different only in a range of manufacturing variation.

The depth of the body region 28 is, for example, in a range from 0.2 μm to 0.6 μm. The thickness of the body region 28 in the depth direction is, for example, in a range from 0.1 μm to 0.3 μm. The depth of each of the first channel region 28a, the second channel region 28b, and the intermediate region 28c is substantially the same, and the thickness of each of the first channel region 28a, the second channel region 28b, and the intermediate region 28c in the depth direction is substantially the same. As such, upper and lower surfaces of the first channel region 28a, the second channel region 28b, and the intermediate region 28c are substantially at the same level. Differences in the depths and the thicknesses of the first channel region 28a, the second channel region 28b, and the intermediate region 28c would be within the range of manufacturing variation.

The n⁺ type first source region 30a is provided between the drift region 26 and the source electrode 12. The first source region 30a is provided between the first channel region 28a and the source electrode 12.

The first source region 30a contains, for example, phosphorus (P) as the n⁻ type impurity. The impurity concentration of the n⁻ type impurity of the first source region 30a is higher than the impurity concentration of the n⁻ type impurity of the drift region 26.

The impurity concentration of the n⁻ type impurity of the first source region 30a is, for example, in a range from $1 \times 10^{19}$ cm⁻³ to $1 \times 10^{21}$ cm⁻³. The depth of the first source region 30a is less than the depth of the body region 28, and is, for example, in a range from 0.1 μm to 0.3 μm. The distance between the drift region 26 and the first source region 30a is, for example, 0.1 μm to 0.3 μm.

The n⁺ type second source region 30b is provided between the drift region 26 and the source electrode 12. The second source region 30b is provided between the second channel region 28b and the source electrode 12.

The second source region 30b contains, for example, phosphorus (P) as the n⁻ type impurity. The impurity concentration of the n⁻ type impurity of the second source region 30b is higher than the impurity concentration of the n⁻ type impurity of the drift region 26.

The impurity concentration of the n⁻ type impurity of the second source region 30b is, for example, in a range from $1 \times 10^{19}$ cm⁻³ to $1 \times 10^{21}$ cm⁻³. The depth of second source region 30b is shallower than the depth of the body region 28, and is, for example, in a range from 0.1 μm to 0.3 μm. The distance between the drift region 26 and the second source region 30b is, for example, in a range from 0.1 μm to 0.3 μm.

The first source region 30a and the second source region 30b have the same shape and the same impurity concentration in the range of manufacturing variation.

The p⁺ type contact region 32 is provided between the intermediate region 28c and the source electrode 12. The p⁺ type contact region 32 is provided between the first source region 30a and the second source region 30b. The impurity concentration of the p⁺ type impurity of the contact region 32 is higher than the impurity concentration of the p type impurity of the body region 28.

The contact region 32 has a function of reducing the contact resistance of the source electrode 12.

The contact region 32 contains, for example, aluminum (Al) as the p⁺ type impurity.

The first gate electrode 18a is provided between the source electrode 12 and the drain electrode 14. The first gate electrode 18a is provided in the first trench 22a which is formed in the silicon carbide layer 10. The first gate electrode 18a is provided on the first gate insulating film 16a.

The first gate electrode 18a is a conductive layer. The first gate electrode 18a is polycrystalline silicon containing, for example, the p⁻ type impurity or the n⁻ type impurity.

The second gate electrode 18b is provided between the source electrode 12 and the drain electrode 14. The second gate electrode 18b is provided in the second trench 22b which is formed in the silicon carbide layer 10. The second gate electrode 18b is provided on the second gate insulating film 16b.

The second gate electrode 18b is a conductive layer. The second gate electrode 18b is polycrystalline silicon containing, for example, the p type impurity or the n⁻ type impurity.

The first gate insulating film 16a is provided between the drift region 26 and the first channel region 28a, and between the first source region 30a and the first gate electrode 18a. The first gate insulating film 16a is provided in the first trench 22a.

The silicon carbide layer 10 of the first gate insulating film 16a extends through the body region 28. In other words, the distance between the first gate insulating film 16a and the drain electrode 14 is less than the distance between the body region 28 and the drain electrode 14.

The first gate insulating film 16a is, for example, a silicon oxide film. For example, it is possible to apply a high dielectric constant insulating film (High-k insulating film) to the first gate insulating film 16a.

The second gate insulating film 16b is provided between the drift region 26 and the second channel region 28b, and between the second source region 30b and the second gate electrode 18b. The second gate insulating film 16b is provided in the second trench 22b.

The silicon carbide layer 10 of the second gate insulating film 16b extends through the body region 28. In other words, the distance between the second gate insulating film 16b and the drain electrode 14 is shorter than the distance between the body region 28 and the drain electrode 14.

The second gate insulating film 16b is, for example, a silicon oxide film. For example, it is possible to use a high dielectric constant insulating film (High-k insulating film) as the second gate insulating film 16b.

The p⁺ type first stopper region 34a is provided between the drift region 26 and the first source region 30a. The first stopper region 34a is provided between the first channel region 28a and the second channel region 28b. The first stopper region 34a is provided between the first channel region 28a and the intermediate region 28c.

The first stopper region 34a is in contact with the drift region 26 and the first source region 30a. The impurity concentration of the p⁺ type impurity of the first stopper region 34a is higher than the impurity concentration of the p⁺ type impurity of the first channel region 28a.

The first stopper region 34a has the function of reducing the channel leakage current when the MOSFET 100 is turned off.

The distance between the first gate insulating film 16a and first stopper region 34a is, for example, in a range from 10 nm to 100 nm. Note that, the distance between the first gate insulating film 16a and the first stopper region 34a means the distance from an interface between the first gate insulating film 16a and the first channel region 28a to a location of the peak of a p⁺ type impurity distribution of the first stopper region 34a.

The distance between the first stopper region 34a and the drain electrode 14 is shorter than the distance between the first gate insulating film 16a and the drain electrode 14. In other words, a depth of the first stopper region 34a is shallower than a de depth of the first trench 22a.

The first stopper region 34a contains, for example, aluminum (Al) as the p⁺ type impurity. The impurity concentration of the p⁺ type impurity of the first stopper region 34a is, for example, in a range from $5 \times 10^{17}$ cm⁻³ to $5 \times 10^{18}$ cm⁻³.

The impurity concentration of the p⁺ type impurity of the first stopper region 34a is, for example, two times to 100 times the impurity concentration of the p type impurity of the first channel region 28a.

The first stopper region 34a can be formed by introducing the p⁺ type impurity into the silicon carbide layer 10 from the side surface of the first trench 22a by angled ion implantation after forming the first trench 22a, for example. In addition, for example, the etching of the first trench 22a is performed in a first etch step and a second etch step. For example, after the first etch step, the p⁺ type impurity is introduced into the silicon carbide layer 10, and then the second etch step is performed, thereby forming the first stopper region 34a which is shallower than the depth of the first trench 22a.

The p⁺ type second stopper region 34b is provided between the drift region 26 and the second source region 30b. The second stopper region 34b is provided between the first channel region 28a and the second channel region 28b. The second stopper region 34b is provided between the second channel region 28b and the intermediate region 28c.

The second stopper region 34b is in contact with the drift region 26 and the second source region 30b. The impurity concentration of the p⁺ type impurity of the second stopper region 34b is higher than the impurity concentration of the p type impurity of the second channel region 28b.

The second stopper region 34b has a function of reducing the channel leakage current when the MOSFET 100 is turned off.

The distance between the second gate insulating film 16b and the second stopper region 34b is, for example, in a range from 10 nm to 100 nm. Note that, the distance between the second gate insulating film 16b and the second stopper region 34b means the distance from an interface between the second gate insulating film 16b and the second channel region 28b to a peak position of a p⁺ type impurity distribution of the second stopper region 34b.

The distance between the second stopper region 34b and the drain electrode 14 is less than the distance between the second gate insulating film 16b and the drain electrode 14. In other words, the depth of the second stopper region 34b is shallower than the depth of the second trench 22b.

The second stopper region 34b contains, for example, aluminum (Al) as the p⁺ type impurity. The impurity concentration of the p⁺ type impurity of the second stopper region 34b is, for example, in a range from $5 \times 10^{17}$ cm⁻³ to $5 \times 10^{18}$ cm⁻³.

The impurity concentration of the p⁺ type impurity of the second stopper region 34b is, for example, two times to 100 times the impurity concentration of the p type impurity of the second channel region 28b.

The second stopper region 34b can be formed by introducing, the p⁺ type impurity into the silicon carbide layer 10 from the side surface of the second trench 22b by angled ion implantation after forming the second trench 22b, for example. In addition, for example, the etching of the second trench 22b is performed in a first step and the second step. For example, after the first step, the p⁺ type impurity is introduced into the silicon carbide layer 10, and then the second step is performed, thereby forming the second stopper region 34b which is shallower than the depth of the second trench 22b.

The first interlayer insulating film 20a is provided on the first gate electrode 18a. The first interlayer insulating film 20a is, for example, a silicon oxide film.

The second interlayer insulating film 20b is provided on the second gate electrode 18b. The second interlayer insulating film 20b is, for example, a silicon oxide film.

The source electrode 12 is provided on the surface of the silicon carbide layer 10. The source electrode 12 is in contact with the first source region 30a, the second source region 30b, and the contact region 32.

The source electrode 12 contains metal. The metal forming the source electrode 12 has a layered structure formed of, for example, titanium (Ti) and aluminum (Al). The source electrode 12 may contain metal silicide or metal carbide which is in contact with the silicon carbide layer 10.

The drain electrode 14 is provided on the rear surface of the silicon carbide layer 10. The drain electrode 14 is in contact with the drain region 24.

The drain electrode 14 is made of, for example, metal or a metal semiconductor compound. The drain electrode 14 contains a material which is selected from the group consisting of, for example, nickel silicide (NiSi), titanium (Ti), nickel (Ni), silver (Ag), and gold (Au).

Hereinafter, actions and effects of the semiconductor device according to the embodiment will be described.

The trench gate type MOSFET 100 according to the embodiment can be miniaturized as compared with a MOSFET having a planar structure. Accordingly, it is possible to improve a channel density. Thus, the on-state resistance of the MOSFET is reduced.

In order to further reduce the on-state resistance, it is considered that the channel resistance is reduced by making the channel length short. The channel length corresponds to the distance between the drain and the source.

However, when the channel length is shortened, there is a problem in that the amount of the channel leakage currents flowing between the drain and the source is increased when the MOSFET 100 is turned off. The channel leakage current is also referred to as a subthreshold current.

Figure 2:
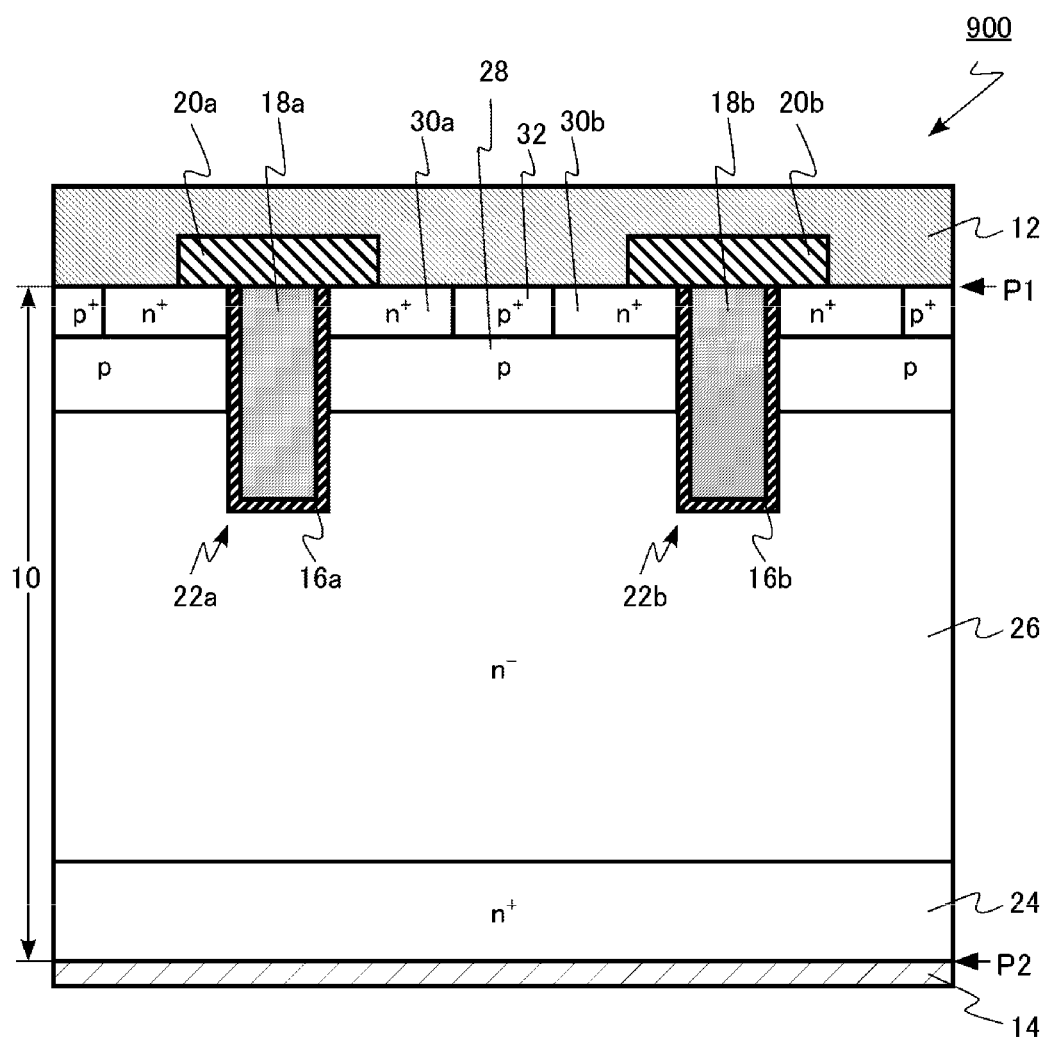
FIG. 2 is a schematic sectional view of a semiconductor device according to a comparative example.

FIG. 2 is a schematic sectional view a semiconductor device according to a comparative example. A MOSFET 900 according to the comparative example is different from the MOSFET 100 according to the embodiment from the aspect that the MOSFET 900 is not provided with first stopper region 34a and the second stopper region 34b.

When the channel length is shortened, a surface potential of the channel region is easily lowered by a depletion layer which extends from the drain region or the source region to the channel region. Accordingly, when the channel length is shortened, the amount of the channel leakage current is increased.

In the MOSFET 900, the channel region is in the vicinity of the region where the body region 28 is in contact with the first gate insulating film 16a, and in the vicinity of the region where the body region 28 is in contact with the second gate insulating film 16b. When the MOSFET 900 is turned off, there is a problem in that the surface potential of the channel region is lowered by the depletion layer extending from the drift region 26 to the body region 28, and the depletion layer extending from the first source region 30a and the second source region 30b to the body region 28.

In the MOSFET 100 according to the embodiment, the first stopper region 34a is provided at a position adjacent to the first channel region 28a. The impurity concentration of the p⁺ type impurity of the first stopper region 34a is higher than the impurity concentration of the p type impurity of the first channel region 28a.

Accordingly, when the depletion layer is prevented from extending from the drift region 26 to the first channel region 28a, and the depletion layer is prevented from extending from the first source region 30a to the first channel region 28a, it is possible to prevent the surface potential from being lowered. Accordingly, the amount of the channel leakage currents of the MOSFET 100 is decreased.

Particularly, since the first channel region 28a continuously exists from the drift region 26 to the first source region 30a, the surface potential of the first channel region 28a is prevented from being lowered.

The distance between the first gate insulating film 16a and the first stopper region 34a is preferably in a range from 10 nm to 100 nm. When the impurity concentration is lower than the above range, there is a concern that a threshold voltage of the MOSFET 100 is increased. When the impurity concentration is higher than the above range, there is a concern that the surface potential of the first channel region 28a is not sufficiently prevented from being lowered.

In addition, the impurity concentration of the p⁺ type impurity of the first stopper region 34a is preferably two times to 100 times the impurity concentration of the p type impurity of the first channel region 28a. When the impurity concentration is lower than the above range, there is a concern that the surface potential of the first channel region 28a is not sufficiently prevented from being lowered. When the impurity concentration is higher than the above range, the amount of the leakage current is likely to be increased.

In addition, the depth of the first stopper region 34a is preferably less than the depth of the first trench 22a. When the depth of the first stopper region 34a is deeper than the depth of the first trench 22a, there is a concern that the on-state resistance of the MOSFET 100 is increased due to the resistance of the drift region 26 having a small width between the first stopper region 34a and the first trench 22a.

When the second stopper region 34b is provided, the same effect as that of the first channel region 28a can be obtained. Accordingly, the amount of the channel leakage currents of the MOSFET 100 is decreased.

Similarly to the case of the first stopper region 34a, the distance between the second gate insulating film 16b and the second stopper region 34b is preferably in a range from 10 nm to 100 nm.

Similar to the case of the first stopper region 34a, the impurity concentration of the p⁺ type impurity of the second stopper region 34b is preferably 2 times to 100 times as high as the impurity concentration of the p type impurity of the second channel region 28b.

Similarly to the case of the first stopper region 34a, the depth of the second stopper region 34b is preferably shallower than the depth of the second trench 22b.

In addition, in the embodiment, when the MOSFET 100 is turned off, it is possible to cause an electric field concentration at a corner of a bottom of the first stopper region 34a on the intermediate region 28c side thereof. Similarly, it is possible to cause the electric field concentration at a corner of a bottom of the second stopper region 34b on the intermediate region 28c side. Accordingly, it is possible to enhance breakdown voltage of the MOSFET 100. Accordingly, it is possible to increase avalanche resistance of the MOSFET 100.

As described above, according to the embodiment, the MOSFET 100 which is capable of reducing the channel leakage current is achieved.

Second Embodiment

In the semiconductor device according to the second embodiment, the silicon carbide layer is further provided with a second conductivity type sixth region between the first portion of the second region, the trench, the fourth portion of the second region, and the first region. The impurity concentration of the second conductivity type in the sixth region is less than that of the first portion of the second region. From this aspect, the semiconductor device according to the second embodiment is different from that according to the first embodiment. Hereinafter, the same content at that in the first embodiment will not be described.

Figure 3:
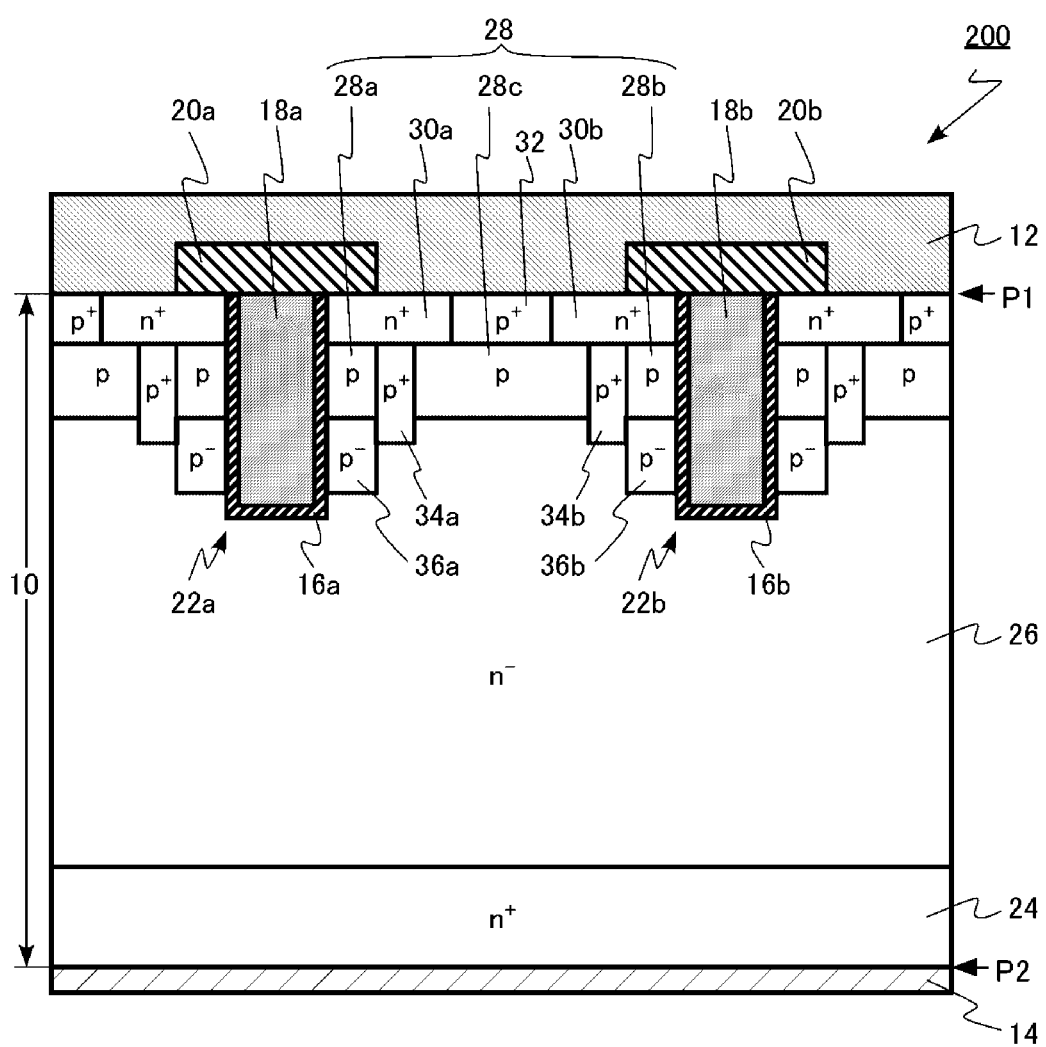
FIG. 3 is a schematic sectional view of a semiconductor device according to a second embodiment.

FIG. 3 is a schematic sectional view of the semiconductor device according to the embodiment.

A MOSFET 200 is provided with a p$^-$ type first low concentration region (the ninth silicon carbide region) 36a and a p$^-$ type second low concentration region (tenth silicon carbide region) 36b.

The first low concentration region 36a is provided between the drift region 26 and the first channel region 28a. The first low concentration region 36a is in contact with the first gate insulating film 16a.

The distance between the first low concentration region 36a and the drain electrode 14 is less than the distance between the first gate electrode 18a and the drain electrode. In other words, the depth of the first low concentration region 36a is less than the depth of the first gate electrode 18a.

The impurity concentration of the p$^-$ type impurity of the first low concentration region 36a is lower than the impurity concentration of the p$^-$ type impurity of the first channel region 28a.

The first low concentration region 36a contains, for example, aluminum (Al) as the p$^-$ type impurity. The impurity concentration of the p$^-$ type impurity of the first low concentration region 36a is in a range from, for example, $5 \times 10^{15}$ cm$^{-3}$ to $5 \times 10^{16}$ cm$^{-3}$.

The p$^-$ type second low concentration region 36b is provided between the drift region 26 and the second channel region 28b. The second low concentration region 36b is in contact with the second gate insulating film 16b.

The distance between the second low concentration region 36b and the drain electrode 14 is less than the distance between the second gate electrode 18b and the drain electrode. In other words, the depth of the second low concentration region 36b is less than the depth of the second gate electrode 18b.

The impurity concentration of the p$^-$ type impurity of the second low concentration region 36b is lower than the impurity concentration of the p type impurity of the second channel region 28b.

The second low concentration region 36b contains, for example, aluminum (Al) as the p$^-$ type impurity. The impurity concentration of the p$^-$ type impurity of the second low concentration region 36b is, for example, in a range from $5 \times 10^{15}$ cm$^{-3}$ to $5 \times 10^{16}$ cm$^{-3}$.

When the first low concentration region 36a is provided, the depletion layer is further prevented from extending to the first channel region 28a as compared with the MOSFET 100 according to the first embodiment. Accordingly, the amount of channel leakage current of the MOSFET 200 is decreased.

In addition, when the first low concentration region 36a is provided, the electric field concentration is relaxed at a bottom of the first trench 22a. Accordingly, the first gate insulating film 16a due to the electric field concentration at the bottom of the first trench 22a is prevented from being damaged. Accordingly, the reliability of the MOSFET 200 is improved.

Note that, when the MOSFET 200 is turned on, a voltage of the p$^-$ type first low concentration region 36a is strongly inverted to a gate voltage applied to the first gate electrode 18a. Accordingly, the increase in the on-state resistance is reduced by providing the p$^-$ type first low concentration region 36a.

The same effect as that of the first low concentration region 36a is obtained by providing the second low concentration region 36b. Accordingly, the amount of the channel leakage current of the MOSFET 200 is decreased. In addition, the reliability of the MOSFET 200 is improved.

As described above, according to the embodiment, the MOSFET 200 which is capable of reducing the channel leakage current is achieved. Further, the MOSFET 200 which is capable of improving the reliability is achieved.

Third Embodiment

In the semiconductor device of the third embodiment, the distance between the sixth silicon carbide region and the second electrode is less than the distance between the first gate insulating film and the second electrode, and the distance between the seventh silicon carbide region and the second electrode is less than the distance between the second gate insulating film and the second electrode. From this aspect, the semiconductor device of the third embodiment is different from that of the first embodiment. Hereinafter, the same content at that in the first embodiment will not be described.

Figure 4:
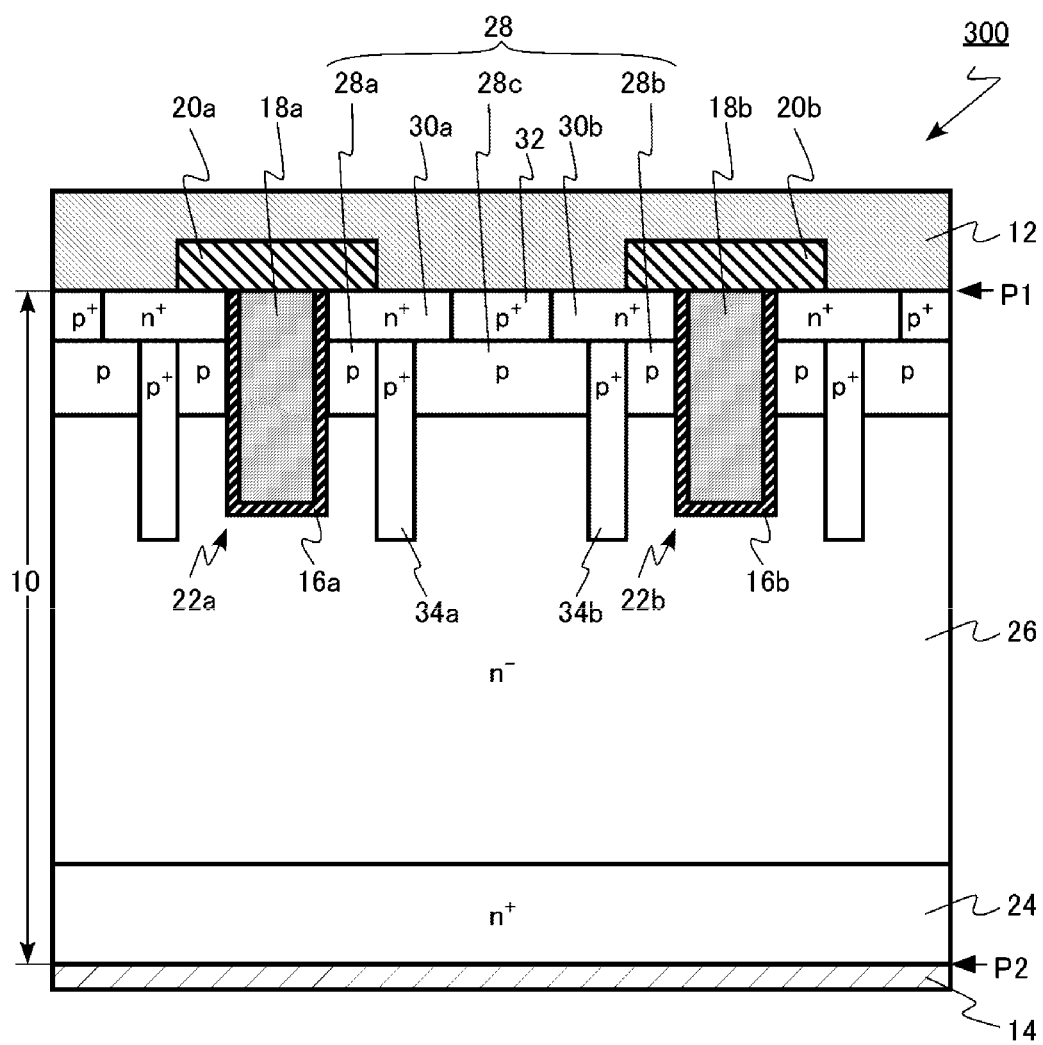
FIG. 4 is a schematic sectional view of a semiconductor device according to a third embodiment.

FIG. 4 is a schematic sectional view of the semiconductor device of the embodiment.

In a MOSFET 300, the distance between the first stopper region 34a and the drain electrode 14 is less than the distance between the first gate insulating film 16a and the drain electrode 14. In other words, the depth of the first stopper region 34a is deeper than the depth of the first trench 22a.

In addition, in the MOSFET 300, the distance between the second stopper region 34b and the drain electrode 14 is less than the distance between the second gate insulating film 16b and the drain electrode 14. In other words, the depth of the second stopper region 34b is deeper than the depth of the second trench 22b.

When the depth of the first stopper region 34a is deeper than the depth of the first trench 22a, the electric field concentration at the bottom of the first trench 22a is reduced. Accordingly, damage to the first gate insulating film 16a due to the electric field concentration at the bottom of the first trench 22a is prevented.

In addition, when the depth of the second stopper region 34b is deeper than the depth of the second trench 22b, the electric field concentration at the bottom of the second trench 22b is reduced. Accordingly, damage to the second gate insulating film 16b due to the electric field concentration at the bottom of the second trench 22b is prevented.

As described above, according to the embodiment, the MOSFET 300 which is capable of reducing the channel leakage current is achieved. Further, the MOSFET 300 which is capable of improving the reliability is achieved.

Fourth Embodiment

The silicon carbide layer of the semiconductor device according to the fourth embodiment further includes a seventh silicon carbide region of the second conductivity type which extends through the third portion of the second region from the third region and terminates inwardly or the first region. The impurity concentration of the second type impurity is larger in the seventh region than in the third portion of the second region. The seventh region extends closer to the first electrode than does the fourth and fifth portions of the second region. From this aspect, the semiconductor device according to the fourth embodiment is different from that according to the first embodiment. Hereinafter, the same content at that in the first embodiment will not be described.

Figure 5:
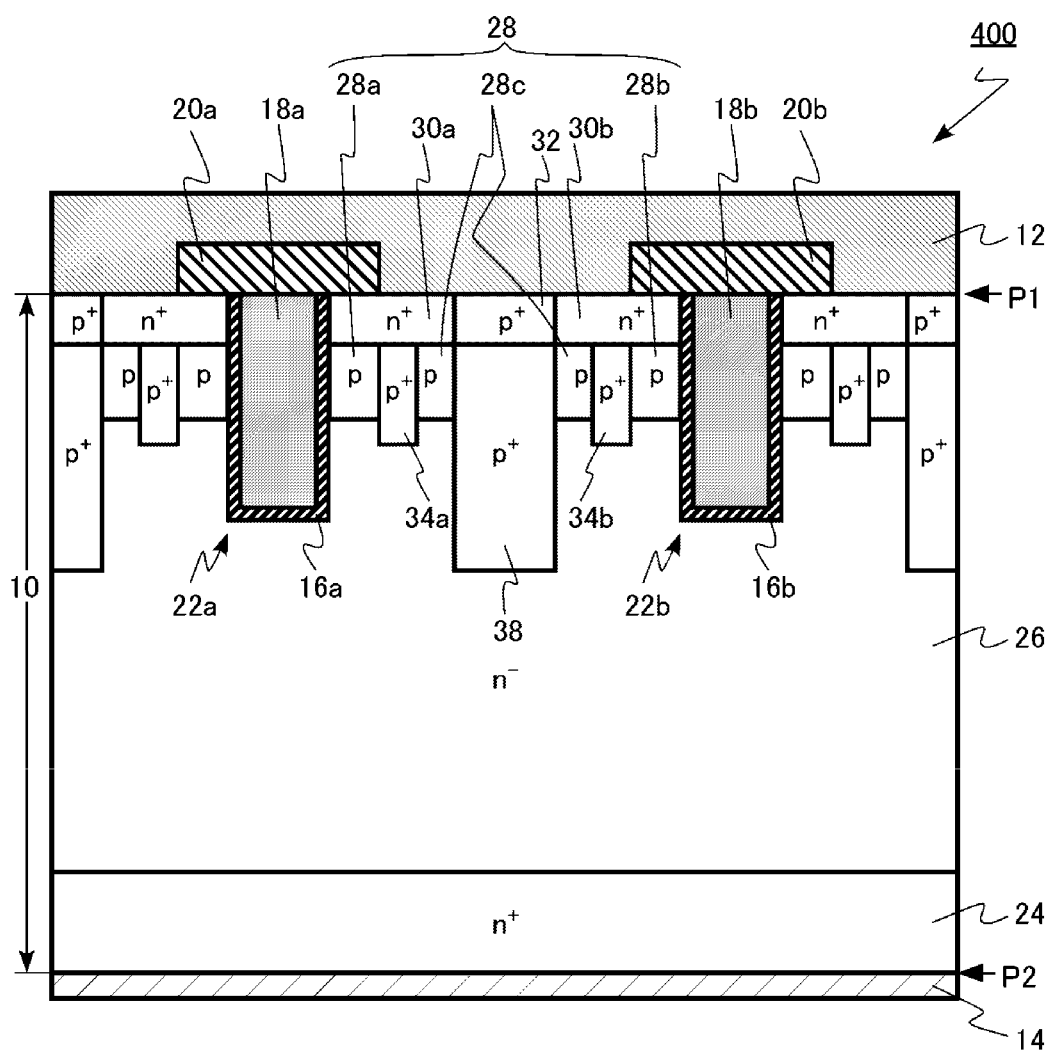
FIG. 5 is a schematic sectional view of a semiconductor device according to a fourth embodiment.

FIG. 5 is a schematic sectional view of the semiconductor device according to the embodiment.

A MOSFET 400 is provided with a p+ type electric field relaxation region (the eleventh silicon carbide region) 38.

The p+ type electric field relaxation region 38 is provided in the drift region (the first silicon carbide region) 26 and between the intermediate regions (the eighth silicon carbide region) 28c.

The distance between the electric field relaxation region 38 and the drain electrode 14 is less than the distance between the first gate insulating film 16a and the drain electrode 14, and less than the distance between the second gate insulating film 16b and the drain electrode 14. In other words, the depth of the electric field relaxation region 38 is deeper than the depth of each of the first trench 22a and the second trench 22b.

The impurity concentration of the p+ type impurity of the electric field relaxation region 38 is higher than the impurity concentration of the p type impurity of the intermediate region 28c.

The electric field relaxation region 38 contains, for example, aluminum (Al) as the p+ type impurity. The impurity concentration of the p+ type impurity of the electric field relaxation region 38 is, for example, in a range from $5 \times 10^{17}$ cm$^{-3}$ to $5 \times 10^{18}$ cm$^{-3}$.

When the electric field relaxation region 38 is provided, the electric field concentration is reduced at the bottom of the first trench 22a, as compared with the MOSFET 100 in the first embodiment. In addition, the electric field concentration is reduced at the bottom of the second trench 22b.

Accordingly, damage to the first gate insulating film 16a due to the electric field concentration at the bottom of the first trench 22a is prevented. In addition, damage to the second gate insulating film 16b due to the electric field concentration at the bottom of the second trench 22b is prevented.

As described above, according to the embodiment, a MOSFET 400 which is capable of reducing the channel leakage current is achieved. Further, a MOSFET 400 which is capable of having improved reliability is achieved.

In the first to fourth embodiments, examples of a MOSFET are described; however, the disclosure is applicable to an insulated gate bipolar transistor (IGBT). In a case of the IGBT, a p+ type collector region is provided instead of the n+ type drain region 24. In addition, the first source region 30a and the second source region 30b are respectively referred to as a first emitter region and a second emitter region. Further, the first electrode corresponds to an emitter electrode, and the second electrode corresponds to a collector electrode.

In the first to fourth embodiments, a 4H—SiC structure is described as the SiC crystal structure; however, the disclosure is applicable to a device which uses other SiC crystal structures such as 6H—SiC and 3C—SiC. Further, it is possible to apply a plane other than the (0001) plane to the surface of the silicon carbide layer 10.

In the first to fourth embodiments, the first conductivity type is the n type and the second conductivity type is the p type; however, the first conductivity type can be set to be the p type, and the second conductivity type can be set to be the n type.

In the first to fourth embodiments, aluminum (Al) is exemplified as the p type impurity; however, it is possible to use boron (B). In addition, nitrogen (N) and phosphorus (P) are exemplified as the n− type impurity; however, it is possible to use arsenic (As), antimony (Sb), and the like.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device, comprising:
a first electrode;
a second electrode;
a silicon carbide layer between the first electrode and the second electrode in a first direction, the silicon carbide layer comprising:
a first region of a first conductivity type between the first electrode and the second electrode in the first direction;
a contact region of a second conductivity type between the first region and the first electrode in the first direction;
a second region and a third region of the first conductivity type between the first region and the first electrode in the first direction; and
a fourth region, a fifth region, a sixth region, a seventh region, and an eighth region of the second conductivity type between the first region and the first electrode in the first direction;
a first trench extending through the fourth region in the first direction and terminating within the first region, the first trench having an insulating layer formed on the sidewalls and base thereof; and
a second trench extending through the fifth region in the first direction and terminating within the first region, the second trench having an insulating layer formed on the sidewalls and base thereof, wherein:
the second region is between the contact region and the first trench in a second direction intersecting the first direction, and the third region is between the contact region and the second trench in the second direction,
the sixth region is between the fourth region and the eighth region, and the seventh region between the eighth region and the fifth region,
the fourth, fifth, and eighth regions have a lower impurity concentration of the second conductivity type than that of the sixth and seventh regions, and
the sixth and seventh regions extend closer to the second electrode than the fourth, fifth, and eighth regions.

2. The semiconductor device of claim 1, wherein a distance from the first and second trenches to the second electrode in the first direction is less than a distance from the sixth and seventh regions to the second electrode in the first direction.

3. The semiconductor device of claim 1, wherein a distance from the sixth and seventh regions to the second electrode is less than a distance from the first and second trenches to the second electrode.

4. The semiconductor device of claim 1, wherein:
the sixth region is between the second region and the first region in the first direction; and
the seventh region is between the third region and the first region in the first direction.

5. The semiconductor device of claim 1, wherein the silicon carbide layer further comprises a first low concentration region of the second conductivity type between the fourth and the first region in the first direction.

6. The semiconductor device of claim 1, wherein the silicon carbide layer further comprises an electric field relaxation region of the second conductivity type extending from the contact region through the eighth region in the first direction, and terminating within the first region.

7. The semiconductor device of claim 6, wherein the electric field relaxation region is closer to the second electrode than the first and second trenches are.

8. The semiconductor device of claim 1, further comprising an insulating layer extending between the second trench and the first electrode in the first direction, and at least partially over the third region.

9. The semiconductor device of claim 1, wherein the silicon carbide layer further comprises a drain region of the first conductivity type between the first region and the second electrode, the drain region having a higher impurity concentration of the first conductivity type than the first region.

10. The semiconductor device of claim 1, further comprising a first trench electrode in the first trench and a second trench electrode in the second trench.

11. A semiconductor device, comprising:
a first electrode, a second electrode, and a silicon carbide layer therebetween in a first direction, the silicon carbide layer having a first surface contacting the first electrode and a second surface contacting the second electrode;
a first gate electrode and a second gate electrode extending inwardly of the first surface of the silicon carbide layer in the first direction towards the second electrode;
an insulating layer between the first and second gate electrodes in the first direction;
a first channel region of the silicon carbide layer located inwardly of the first surface, between the first gate electrode and the second electrode in a second direction intersecting the first direction, and adjacent to a first side surface of the first gate electrode and containing a first type impurity of a first concentration;
a second channel region of the silicon carbide layer located inwardly of the first surface, between the first gate electrode and the second electrode in a second direction intersecting the first direction, and adjacent to a second side surface of the second gate electrode and containing the first type impurity of the first concentration;
an intermediate region of the silicon carbide layer located inwardly of the first surface and between the first channel region and the second channel region in the second direction, the intermediate region containing the first type impurity;
a first stopper region of the silicon carbide layer located inwardly of the first surface and between the first channel region and the intermediate region in the second direction, the first stopper region extending in the silicon carbide layer to a position closer to the second electrode than the closest position of the first channel region and the intermediate region to the second electrode, the first stopper region having the first type impurity of a second concentration, the second concentration being higher than the first concentration;
a first low concentration region of the silicon carbide layer having the first type impurity of the first concentration between the first channel region and the second electrode; and
a second stopper region of the silicon carbide layer having the first type impurity extending through the intermediate region and extending closer to the second electrode than the closest locations of the first and second channel regions and the intermediate region to the second electrode.

12. The semiconductor device of claim 11, further comprising:
a second stopper region of the silicon carbide layer located inwardly of the first surface and between the second channel region and the intermediate region in the second direction, the second stopper region extending in the silicon carbide layer to a position closer to the second electrode than the closest position of the first channel region and the intermediate region to the second electrode, the second stopper region having the first type impurity of a third concentration, the third concentration being higher than the first concentration.

13. The semiconductor device of claim 11, wherein the first stopper region extends to a position closer to the second electrode than the closest position of the first and second gate electrodes to the second electrode.

14. A semiconductor device, comprising:
a silicon carbide layer having a first surface and a second surface opposite to the first surface;
a first electrode on the first surface;
a second electrode contacting the second surface;
a first trench and a second trench extending inwardly of the first surface of the silicon carbide layer, and spaced apart on the first surface in a first direction, the silicon carbide layer extending between the first and second trenches in a second direction intersecting the first direction;
a first trench electrode in the first trench and a second trench electrode in the second trench; and
a first insulating layer between the first trench electrode and the first electrode and a second insulating layer between the second trench electrode and the first electrode, wherein
the silicon carbide layer comprises:
a drift region of a first conductivity type;
a body region of a second conductivity type between the drift region and the first electrode in the second direction; and
a contact region of the second conductivity type between the body region and the first electrode, and spaced from both trenches in the first direction,
the body region comprises:
a first channel region extending in the first direction from the first trench towards the second trench;
an intermediate region spaced from the first channel region and between the first and second trenches;
a second channel region extending in the first direction from the second trench towards the first trench;
a first stopper region interposed between the first channel region and the intermediate region;
a second stopper region interposed between the intermediate region and the second channel region;
a first source region of the first conductivity type between the first trench and the contact region; and a second source region of the first conductivity type between the second trench and the contact region, the first and second stopper regions have a higher impurity concentration of the second conductivity type than that of the first and second channel regions and the intermediate region, and at least one of the first and second stopper regions extends closer to the second electrode than any of the first and second channel regions and the intermediate region.

15. The semiconductor device of claim 14, wherein the first stopper region is located closer to the second electrode than are the first and second trenches.

16. The semiconductor device of claim 14, wherein the first and second trenches are located closer to the second electrode than is the first stopper region.

* * * * *